United States Patent
Yang et al.

(10) Patent No.: US 10,251,320 B2
(45) Date of Patent: Apr. 2, 2019

(54) MANAGING DEVICE FOR COOLING INVERTER

(71) Applicant: LSIS CO., LTD., Anyang-si, Gyeonggi-do (KR)

(72) Inventors: Chun-Suk Yang, Anyang-si (KR); Tae-Suk Bae, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/868,669

(22) Filed: Jan. 11, 2018

(65) Prior Publication Data

US 2018/0270995 A1    Sep. 20, 2018

(30) Foreign Application Priority Data

Mar. 20, 2017 (KR) .................. 10-2017-0034765

(51) Int. Cl.
H05K 7/20 (2006.01)
H02M 7/537 (2006.01)
(Continued)

(52) U.S. Cl.
CPC .......... H05K 7/20945 (2013.01); H02H 5/04 (2013.01); H02H 7/0833 (2013.01); H02H 7/0852 (2013.01); H02H 7/122 (2013.01); H02M 7/537 (2013.01); H02P 6/28 (2016.02); H02P 29/68 (2016.02); H05K 7/20909 (2013.01); H02M 2001/327 (2013.01)

(58) Field of Classification Search
CPC . H02M 7/537; H05K 7/2019; H05K 7/20209; H05K 7/20245; H05K 7/20945; H05K 7/20909
See application file for complete search history.

(56) References Cited

U.S. PATENT DOCUMENTS 5,920,264 A * 7/1999 Kim .................. G06F 1/206
  257/E23.08
6,456,508 B1 * 9/2002 Namai .................. H02J 9/062
  318/116

(Continued)

FOREIGN PATENT DOCUMENTS

EP   2413487 A1   2/2012
EP   3101791 A2   12/2016
(Continued)

OTHER PUBLICATIONS

European Search Report for related European Application No. 18151198.1; report dated Aug. 28, 2018; (7 pages).
(Continued)

*Primary Examiner* — Timothy J. Dole
*Assistant Examiner* — Sisay G Tiku
(74) *Attorney, Agent, or Firm* — K&L Gates LLP

(57) ABSTRACT

Disclosed is a managing device for cooling an inverter. The managing device for cooling an inverter includes a fan controller configured to provide an electric current flowing in a cooling fan; and a controller configured to determine whether the current flowing in the cooling fan is out of a preset range, and, when the current is out of the preset range, configured to control the cooling fan with a control voltage different from an operating voltage of the cooling fan.

6 Claims, 4 Drawing Sheets

(51) Int. Cl.
*H02H 7/122* (2006.01)
*H02H 5/04* (2006.01)
*H02H 7/08* (2006.01)
*H02H 7/085* (2006.01)
*H02P 6/28* (2016.01)
*H02P 29/68* (2016.01)
*H02M 1/32* (2007.01)

(56) References Cited

U.S. PATENT DOCUMENTS

| | | | | |
|---|---|---|---|---|
| 6,508,072 | B1* | 1/2003 | Kanazawa | F04B 49/20 |
| | | | | 62/228.4 |
| 2007/0147100 | A1* | 6/2007 | Tashima | H05K 7/20209 |
| | | | | 363/141 |
| 2013/0112367 | A1* | 5/2013 | Kooken | B23K 9/1006 |
| | | | | 165/11.1 |
| 2013/0285486 | A1* | 10/2013 | Imanishi | B60L 3/0061 |
| | | | | 310/53 |
| 2015/0098257 | A1* | 4/2015 | Wei | H02M 5/4585 |
| | | | | 363/37 |
| 2015/0366104 | A1* | 12/2015 | Lim | H05K 7/20209 |
| | | | | 700/282 |
| 2017/0138654 | A1* | 5/2017 | Nakase | F25B 49/025 |
| 2018/0086174 | A1* | 3/2018 | Bidner | B60H 1/00271 |

FOREIGN PATENT DOCUMENTS

| | | |
|---|---|---|
| JP | H09284999 A | 10/1997 |
| JP | 2004068760 A | 3/2004 |
| JP | 2004274903 A | 9/2004 |
| JP | 2005039890 A | 2/2005 |
| JP | 2005176525 A | 6/2005 |
| JP | 2008148510 A | 6/2008 |
| JP | 2009065638 A | 3/2009 |
| JP | 2009281302 A | 12/2009 |
| JP | 2011083152 A | 4/2011 |
| JP | 2014143789 A | 8/2014 |
| KR | 101037875 B1 | 5/2011 |
| WO | 2010109587 A1 | 9/2010 |

OTHER PUBLICATIONS

Japanese Office Action for related Japanese Application No. 2018-005832; action dated Oct. 2, 2018; (5 pages).

* cited by examiner

MANAGING DEVICE FOR COOLING INVERTER

CROSS-REFERENCE TO RELATED APPLICATIONS

Pursuant to 35 U.S.C. § 119(a), this application claims the benefit of earlier filing date and right of priority to Korean Patent Application No. 10-2017-0034765, filed on Mar. 20, 2017, in the Korean Intellectual Property Office, the disclosure of which is hereby incorporated by reference in its entirety.

BACKGROUND

1. Technical Field

The present disclosure relates to a managing device for cooling an inverter.

2. Description of the Related Art

An inverter is a typical power conversion device configured to convert alternating current (AC) power into direct current (DC) power and then convert the converted the DC power to AC power again to control a motor.

The inverter is used across industry categories in various forms including a fan, a pump, an elevator, a conveying device, a production line, and the like.

A general inverter for driving a motor receives three-phase AC power, converts the three-phase AC power into DC power through a rectifying circuit, stores the DC power in a capacitor provided on a DC link, and then converts the stored DC power into AC power in an inverting portion to control a motor.

High-frequency switching elements, such as an insulated gate bipolar transistor (IGBT), a metal oxide semiconductor field effect transistor (MOSFET), and the like, and large-capacity capacitors are used as main components in a power conversion device such as an inverter. Since these components radiate a large amount of heat, a cooling device such as a heat sink, a cooling fan, or the like should be required in the inverter. When the cooling device is not properly provided, a lifetime and reliability of the inverter may be significantly deteriorated and competitiveness thereof in market may also be lost.

Presently, main competitiveness of the inverter in market is sizes and costs of components, and, since an apparatus becomes smaller and smaller, an efficient cooling device is one of core techniques of the inverter.

A conventional method for operating a cooling system of an inverter interrupts an operation of an inverter by generating a trip signal when an abnormality occurs in an electric current flowing in a cooling fan due to a problem related to a connection of the cooling fan or an inflow of foreign materials. However, when the inverter is interrupted, a task performed using the inverter is also interrupted, so that the conventional method for operating a cooling system may bring time and economic disadvantages to a user.

SUMMARY

It is an objective of the present disclosure to provide a managing device for cooling an inverter, which is capable of continuously normally operating an inverter even when a problem occurs at a cooling fan but not lead to burning of the inverter.

In accordance with one aspect of the present disclosure, there is provided a managing device for cooling an inverter device, the managing device including a fan controller configured to provide an electric current of a cooling fan; and a controller configured to determine whether the current of the cooling fan is out of a preset range, and, when the current is out of the preset range, configured to control the cooling fan with a control voltage different from an operating voltage of the cooling fan, wherein the controller may determine the control voltage according to a direction in which the current is out of the preset range.

In one embodiment of the present disclosure, when the current is out of the preset range even though the cooling fan is operated by the control voltage, the controller may interrupt an operation of the inverter.

In one embodiment of the present disclosure, the managing device may further include a temperature sensor configured to sense a temperature in an interior of the inverter, wherein the controller may interrupt an operation of the inverter according to whether the temperature sensed by the temperature sensor exceeds a preset temperature.

In one embodiment of the present disclosure, the managing device may further include a temperature sensor configured to sense a temperature in an interior of the inverter, wherein, when the current is out of the preset range and the temperature sensed by the temperature sensor exceeds a preset temperature even though the cooling fan is operated by the control voltage, the controller may interrupt an operation of the inverter.

In one embodiment of the present disclosure, the controller may include a manipulator configured to receive the current of the cooling fan and output a signal related to the control voltage; and a switched-mode power supply connected to both ends of a capacitor provided on a direct current (DC) link, and configured to receive the signal related to the control voltage, generate a control voltage corresponding to the received signal, and provide the generated control signal to the fan controller.

In one embodiment of the present disclosure, the controller may further include a gate controller and a gate driver, wherein the manipulator may output a trip signal with respect to the cooling fan when the current is out of the preset range even though the cooling fan is operated by the control voltage, the gate controller may receive the trip signal and output a control signal with respect to a switching element of the inverter in response to the trip signal, and the gate driver may release driving of the switching element according to the control signal.

In one embodiment of the present disclosure, the managing device may further include a temperature sensor configured to sense a temperature in an interior of the inverter, wherein the controller may further include a gate controller and a gate driver, the gate controller may output a control signal to the gate driver according to whether the temperature sensed by the temperature sensor exceeds the preset temperature, and the gate driver may release driving of the switching element according to the control signal.

In one embodiment of the present disclosure, the managing device may further include a temperature sensor configured to sense a temperature in an interior of the inverter, wherein the controller may further include a gate controller and a gate driver, the manipulator may output a trip signal with respect to the cooling fan when the current is out of the preset range even though the cooling fan is operated by the control voltage, and, when the current is out of the preset range and the temperature sensed by the temperature sensor exceeds the preset temperature even though the cooling fan

DETAILED DESCRIPTION

Figure 1:
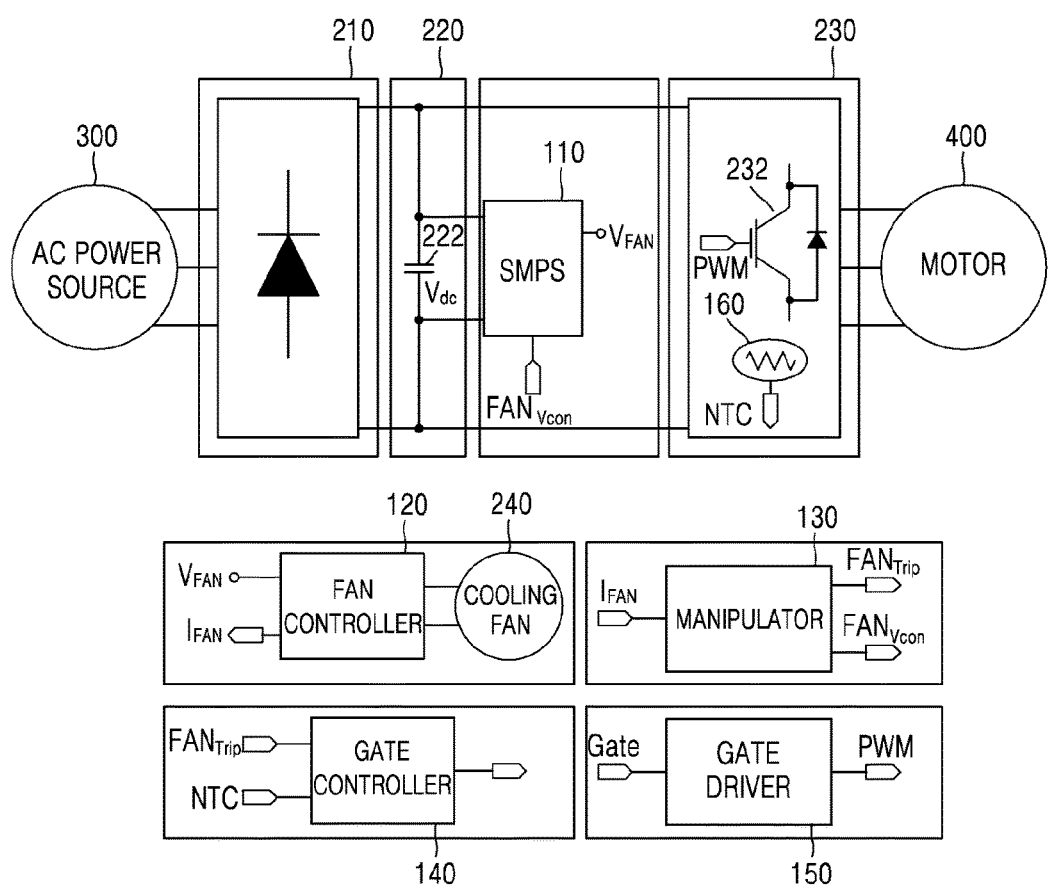
FIG. 1 is a diagram illustrating a managing device for cooling an inverter according to one embodiment of the present disclosure.

The present disclosure may be modified in various forms and may have a variety of embodiments, and, therefore, specific embodiments will be illustrated in the drawings and a description thereof will be described in the following detailed description. The embodiments to be disclosed below, however, are not to be taken in a sense which limits the present disclosure to specific embodiments, and should be construed to include modification, equivalents, or substitutes within the spirit and technical scope of the present disclosure.

Hereinafter, one preferred embodiment according to the present disclosure will be described in detail with reference to the accompanying drawings.

FIG. 1 is a diagram illustrating a managing device for cooling an inverter according to one embodiment of the present disclosure.

Referring to FIG. 1, a rectifier 210 receives power from an alternating current (AC) power supply 300 and rectifies the received power. The rectified power is smoothed by a capacitor 222 provided on a direct current (DC) link of the smoothing part 220. The smoothed power may be connected to an inverter 230 and may be used as an output power provided to a motor 400.

The managing device for cooling an inverter according to one embodiment of the present disclosure includes a switched-mode power supply (SMPS) 110, a fan controller 120, a manipulator 130, a gate controller 140, a gate driver 150, and a temperature sensor 160.

The SMPS 110 may be connected across both ends of the capacitor 222 provided on the DC link and may generate a driving voltage $V_{FAN}$ of the cooling fan 240 using a voltage of the capacitor 222.

The SMPS 110 may be connected to the manipulator 130, may receive a signal $FAN_{Vcon}$ related to a control voltage from the manipulator 130, and may generate a control voltage corresponding to the signal $FAN_{Vcon}$ as the driving voltage $V_{FAN}$ of the cooling fan 240.

The fan controller 120 may be connected to the SMPS 110 and the manipulator 130.

The fan controller 120 may receive the driving voltage $V_{FAN}$ and may drive the cooling fan 240 using the driving voltage $V_{FAN}$.

The fan controller 120 may sense an electric current flowing in the cooling fan 240 and provide information on the sensed current to the manipulator 130.

The manipulator 130 may be connected to the fan controller 120, the gate controller 140, and the SMPS 110.

The manipulator 130 may receive the information on the sensed current from the fan controller 120 and generate a trip signal $FAN_{Trip}$ or the signal $FAN_{Vcon}$ related to the control voltage according to a magnitude of the sensed current. The manipulator 130 may provide the generated trip signal $FAN_{Trip}$ to the gate controller 140, and the signal $FAN_{Vcon}$ related to the generated control voltage to the SMPS 110.

The gate controller 140 may be connected to the manipulator 130 and the temperature sensor 160.

The gate controller 140 may generate a control signal Gate with respect to a switching element 232 such as a gate according to the trip signal $FAN_{Trip}$ received from the manipulator 130.

The gate controller 140 may generate the control signal Gate with respect to the switching element 232 according to temperature information NTC provided from the temperature sensor 160.

The gate controller 140 may determine whether to generate the control signal Gate by utilizing both the trip signal $FAN_{Trip}$ and the temperature information NTC. For example, even when the trip signal $FAN_{Trip}$ is received, the gate controller 140 may not generate the control signal Gate when a temperature is not higher than a set temperature.

The gate driver 150 may provide a pulse-width modulation (PWM) signal to the switching element 232 using the received control signal Gate.

When the received control signal Gate indicates operation stoppage of the inverter 230, the gate driver 150 may provide the PWM signal to the switching element 232 in a manner by releasing an operation of the switching element 232.

The temperature sensor 160 may be disposed inside the inverter 230 to sense a temperature thereof.

The temperature sensor 160 may be connected to the gate controller 140 to provide the sensed temperature information NTC thereto.

The temperature sensor 160 may include a thermal resistance element such as a thermistor. In one embodiment of the present disclosure, a negative temperature coefficient (NTC) thermistor is used, but other types of thermal resistance elements may be used according to embodiments.

Figure 2:
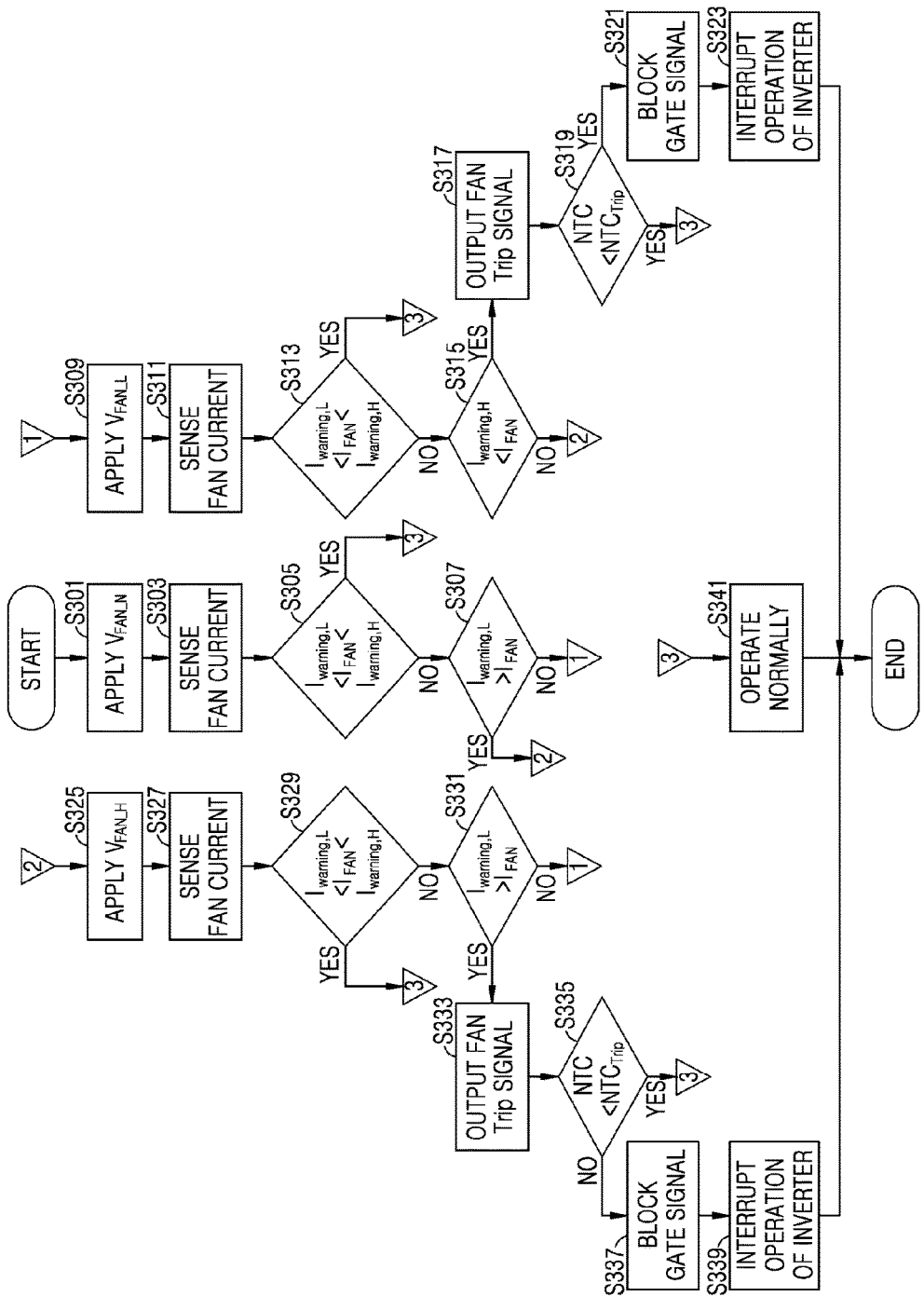
FIG. 2 is a diagram illustrating an operation method for cooling an inverter according to one embodiment of the present disclosure.

FIG. 2 is a diagram illustrating an operation method for cooling an inverter according to one embodiment of the present disclosure.

The operation method for cooling an inverter according to one embodiment of the present disclosure may be performed by the managing device for cooling an inverter according to one embodiment of the present disclosure. Accordingly, the operation method for cooling an inverter according to one embodiment of the present disclosure will be described by focusing on a controller, which includes the SMPS 110, the manipulator 130, the gate controller 140, and the gate driver 150, the fan controller 120, and the temperature sensor 160 as main bodies.

In Operation S301, the controller generates a driving voltage $V_{FAN\_N}$ of the cooling fan 240 to apply the driving voltage $V_{FAN\_N}$ to the cooling fan 240. At this point, the driving voltage $V_{FAN\_N}$ may be a rated voltage with which the cooling fan 240 is conventionally used.

In Operation S303, the fan controller 120 senses an electric current $I_{FAN}$ flowing in the cooling fan 240 to provide the current $I_{FAN}$ to the controller.

In Operation S305, the controller determines whether the current $I_{FAN}$ flowing in the cooling fan 240 is included in a preset range. When the current $I_{FAN}$ is determined to be included in the preset range, the process proceeds to operation S341, and otherwise, the process proceeds to Operation S307.

Whether the current $I_{FAN}$ is included in the preset range may be determined by the following Equation 1.

$$I_{warning,L} < I_{FAN} < I_{warning,H} \quad \text{[Equation 1]}$$

where $I_{warning,L}$ refers to a lower limit value of an allowable current, $I_{FAN}$ refers to the sensed current of the cooling fan 240, and $I_{warning,H}$ refers to an upper limit value of the allowable current.

A magnitude of $I_{warning,L}$ may be defined as 50% with respect to that of a normal current.

A magnitude of $I_{warning,H}$ may be defined as 150% with respect to that of the normal current.

In Operation S307, the controller determines whether the current $I_{FAN}$ of the cooling fan 240 is less than the lower limit value of the allowable current. When the current $I_{FAN}$ of the cooling fan 240 is less than the lower limit value of the allowable current, the process proceeds to Operation S325, and otherwise, the process proceeds to Operation S309.

In Operation S309, the controller may drive the cooling fan 240 by a first control voltage $V_{FAN\_L}$ that is lower than the driving voltage $V_{FAN\_N}$. Since the process proceeding to Operation S309 refers that the current $I_{FAN}$ sensed from the cooling fan 240 is greater than the upper limit value of the normal current, the first control voltage $V_{FAN\_L}$ that is decreased is provided to the cooling fan 240 to decrease a value of the sensed current $I_{FAN}$ to a normal value.

In Operation S311, the fan controller 120 senses the current $I_{FAN}$ flowing in the cooling fan 240 to provide the current $I_{FAN}$ to the controller.

In Operation S313, the controller determines whether the current $I_{FAN}$ of the cooling fan 240 is included in the preset range. When the current $I_{FAN}$ is determined to be included in the preset range, the process proceeds to operation S341, and otherwise, the process proceeds to Operation S315.

In Operation S315, the controller determines whether the current $I_{FAN}$ flowing in the cooling fan 240 is greater than the upper limit value of the allowable current. When the current $I_{FAN}$ flowing the cooling fan 240 is greater than the upper limit value of the allowable current, the process proceeds to Operation S317, and otherwise, the process proceeds to Operation S325.

In Operation S317, the controller may output a trip signal with respect to the cooling fan 240.

In Operation S319, the controller determines whether a temperature NTC sensed by the temperature sensor 160 is less than a preset allowable temperature $NTC_{Trip}$. When the temperature NTC is less than the preset allowable temperature $NTC_{Trip}$, the process proceeds to Operation S341, and otherwise, the process proceeds to Operation S321.

In Operation S321, the controller may block a gate driving signal.

In Operation S323, the controller may interrupt an operation of the inverter to terminate all processes.

In Operation S325, the controller may drive the cooling fan 240 by a second control voltage $V_{FAN\_H}$ that is greater than the driving voltage $V_{FAN\_N}$. Since the process proceeding to Operation S325 refers that the current $I_{FAN}$ sensed from the cooling fan 240 is less than the lower limit value of the normal current, the second control voltage $V_{FAN\_H}$ that is increased is provided to the cooling fan 240 to raise a value of the sensed current $I_{FAN}$ to the normal value, In Operation S327, the fan controller 120 senses the current $I_{FAN}$ flowing in the cooling fan 240 to provide the current $I_{FAN}$ to the controller.

In Operation S329, the controller determines whether the current $I_{FAN}$ flowing in the cooling fan 240 is included in the preset range. When the current $I_{FAN}$ is determined to be included in the preset range, the process proceeds to operation S341, and otherwise, the process proceeds to Operation S331.

In Operation S331, the controller determines whether the current $I_{FAN}$ flowing in the cooling fan 240 is less than the lower limit value of the allowable current. When the current of the cooling fan 240 is less than the lower limit value of the allowable current, the process proceeds to Operation S333, and otherwise, the process proceeds to Operation S309.

In Operation S333, the controller may output the trip signal with respect to the cooling fan 240.

In Operation S335, the controller determines whether the temperature NTC sensed by the temperature sensor 160 is less than the preset allowable temperature $NTC_{Trip}$. When the temperature NTC is less than the preset allowable temperature $NTC_{Trip}$, the process proceeds to Operation S341, and otherwise, the process proceeds to Operation S337.

In Operation S337, the controller may block the gate driving signal.

In Operation S339, the controller may interrupt the operation of the inverter to terminate all processes.

According to the above-described operation method for cooling an inverter, when the current $I_{FAN}$ flowing in the cooling fan 240 is out of the preset range, the controller drives the cooling fan 240 using the control voltage $V_{FAN\_H}$ or $V_{FAN\_L}$. When the current of the cooling fan 240 is out of the preset range in spite of the control voltage $V_{FAN\_H}$ or $V_{FAN\_L}$, the controller outputs the trip signal. Meanwhile, when the temperature NTC in an interior of the inverter is less than the preset allowable temperature $NTC_{Trip}$ even though the trip signal is output with respect to the cooling fan 240, the controller may normally operate the inverter, and, only when the temperature NTC is greater than the preset allowable temperature $NTC_{Trip}$, the controller may bock the gate driving signal to interrupt the operation of the inverter 230.

Figure 3:
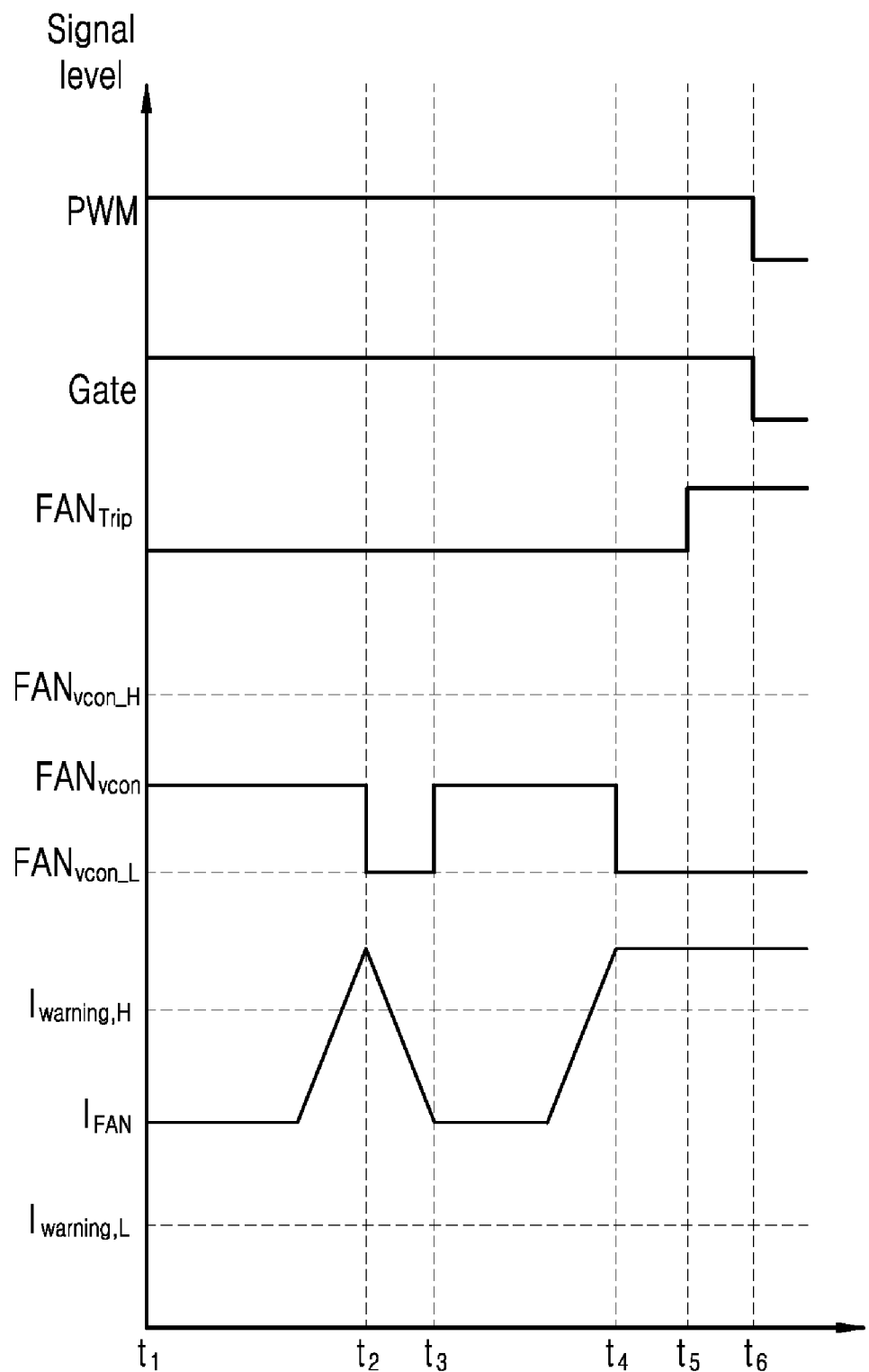
FIG. 3 is a diagram illustrating magnitudes of various signals in the managing device for cooling an inverter according to one embodiment of the present disclosure.

FIG. 3 is a diagram illustrating magnitudes of various signals in the managing device for cooling an inverter according to one embodiment of the present disclosure.

Referring to FIG. 3, t1 to t6 represent times for events, respectively. When power is applied at the time t1, a gate drive signal and a PWM signal operate normally. A driving signal of the cooling fan 240 also indicates a normal driving signal $FAN_{vcon}$.

At the time t2, the current $I_{FAN}$ of the cooling fan 240 rises to be greater than the upper limit value $I_{warning,H}$ of the allowable current. In this case, the controller may output a signal $FAN_{vcon\_L}$ related to a first control voltage to lower the driving voltage of the cooling fan 240 so that the current $I_{FAN}$ flowing in the cooling fan 240 may be reduced.

At the time t3, the controller may determine that the current $I_{FAN}$ flowing in the cooling fan 240 is in the preset range and may normally drive the cooling fan 240.

At the time t4, an event identical to that occurring at the time t2 occurs, and the controller may perform the same operation as at the time t2.

However, at the time t5, when the current $I_{FAN}$ flowing in the cooling fan 240 is determined not to be included in the preset range even though the cooling fan 240 is driven by the control voltage, the controller may output the trip signal $FAN_{Trip}$.

At the time t6, it is assumed that the temperature NTC after the trip signal is output is to be higher than the allowable temperature $NTC_{Trip}$, and, at this point, the controller may interrupt application of the gate driving signal and the PWM signal.

Figure 4:
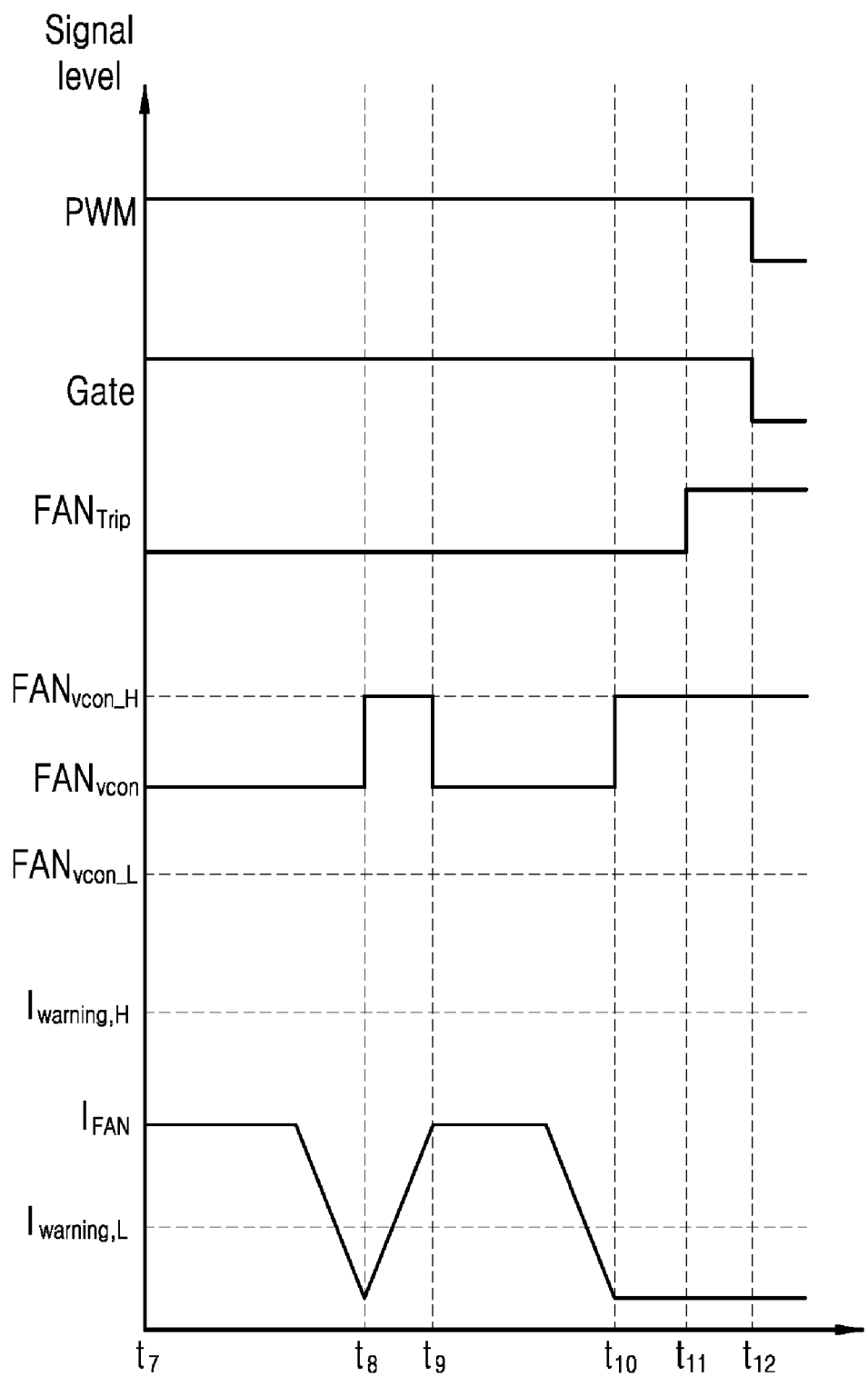
FIG. 4 is a diagram illustrating the magnitudes of the various signals in the managing device for cooling an inverter according to one embodiment of the present disclosure.

FIG. 4 is a diagram illustrating the magnitudes of the various signals in the managing device for cooling an inverter according to one embodiment of the present disclosure.

Referring to FIG. 4, t7 to t12 represent times for events, respectively. When power is applied at the time t7, the gate driving signal and the PWM signal operate normally. The driving signal of the cooling fan 240 also indicates the normal driving signal $FAN_{vcon}$.

At the time t8, the current $I_{FAN}$ flowing in the cooling fan 240 falls to be less than the lower limit value $I_{warning,L}$ of the allowable current. In this case, the controller may output a signal $FAN_{vcon\_H}$ related to a second control voltage to lower the driving voltage of the cooling fan 240 so that the current $I_{FAN}$ flowing in the cooling fan 240 may increase.

At the time t9, the controller may determine that the current $I_{FAN}$ flowing in the cooling fan 240 is in the preset range and may normally drive the cooling fan 240.

At the time t10, an event identical to that occurring at the time t8 occurs, and the controller may perform the same operation as at the time t8.

However, at the time t11, when the current $I_{FAN}$ flowing in the cooling fan 240 is determined not to be included in the preset range even though the cooling fan 240 is driven by the control voltage, the controller may output the trip signal $FAN_{Trip}$.

At the time t12, it is assumed that the temperature NTC after the trip signal is output is to be higher than the allowable temperature $NTC_{Trip}$, and, at this point, the controller may interrupt application of the gate driving signal and the PWM signal.

A conventional operation method for cooling an inverter forcibly interrupts an operation of the inverter when a problem occurs at the cooling fan 240 even though a temperature of the inverter is not a temperature level at which there is a risk of burning. However, according to the present disclosure, normalization of an electric current of the cooling fan 240 is primarily tried according to the current $I_{FAN}$ flowing in the cooling fan 240, and, when the current $I_{FAN}$ flowing in the cooling fan 240 is maintained as a normal value in spite of the normalization, the trip signal is output, and, when the temperature in the interior of the inverter is less than the preset value, the inverter is not interrupted such that operation efficiency of the inverter can be increased.

In accordance with the present disclosure, there is an effect in which, when a problem occurs at the cooling fan but does not lead to burning of the inverter, the inverter can be normally operated.

While the present disclosure has been described with reference to embodiments thereof, the embodiments are merely illustrative, and it should be understood that various modifications and equivalent embodiments can be derived by those who skilled in the art. Accordingly, the true technical scope of the present disclosure should be determined by the following claims.

What is claimed is:

1. A managing device for cooling an inverter device, comprising:

a fan controller configured to provide an electric current of a cooling fan; and a controller configured to determine whether the current flowing in the cooling fan is out of a preset range, and, when the current is out of the preset range, configured to control the cooling fan with a control voltage different from an operating voltage of the cooling fan, wherein, when the current is out of the preset range even though the cooling fan is operated by the control voltage, the controller interrupts an operation of the inverter, wherein the controller includes a manipulator configured to receive the current flowing in the cooling fan and output a signal related to the control voltage; and a switched-mode power supply connected to both ends of a capacitor provided on a direct current (DC) link, configured to receive the signal related to the control voltage from the manipulator, generate the control voltage corresponding to the received signal, and provide the control voltage to the fan controller.

2. The managing device of claim 1, further comprising:

a temperature sensor configured to sense a temperature in an interior of the inverter, wherein the controller interrupts an operation of the inverter according to whether the temperature sensed by the temperature sensor exceeds a preset temperature.

3. The managing device of claim 1, further comprising:

a temperature sensor configured to sense a temperature in an interior of the inverter, wherein, when the current is out of the preset range and the temperature sensed by the temperature sensor exceeds a preset temperature even though the cooling fan is operated by the control voltage, the controller interrupts an operation of the inverter.

4. The managing device of claim 1, wherein the controller further includes:

a gate controller; and a gate driver, wherein the manipulator outputs a trip signal with respect to the cooling fan when the current is out of the preset range even though the cooling fan is operated by the control voltage, the gate controller receives the trip signal, and outputs a control signal with respect to a switching element of the inverter in response to the trip signal, and the gate driver releases an operation of a switching element of the inverter according to the control signal.

5. The managing device of claim 1, further comprising:

a temperature sensor configured to sense a temperature in an interior of the inverter, wherein the controller further includes:

a gate controller; and a gate driver, wherein the gate controller outputs a control signal to the gate driver according to whether the temperature sensed by the temperature sensor exceeds the predetermined temperature, and the gate driver releases an operation of a switching element of the inverter according to the control signal.

6. The managing device of claim 1, further comprising:

a temperature sensor configured to sense a temperature of an interior of the inverter, wherein the controller further includes:

a gate controller; and a gate driver, wherein the manipulator outputs a trip signal with respect to the cooling fan when the current is out of the preset range even though the cooling fan is operated by the control voltage, the controller outputs a control signal to the gate driver when the current is out of the preset range and the temperature sensed by the temperature sensor exceeds the preset temperature even though the cooling fan is operated by the control voltage, and the gate driver releases an operation of a switching element of the inverter according to the control signal.

\* \* \* \* \*